United States Patent
Kumar et al.

(10) Patent No.: US 10,497,405 B2
(45) Date of Patent: Dec. 3, 2019

(54) MEMORY READ CIRCUIT WITH N TYPE AND P TYPE PRE-CHARGE

(71) Applicant: Intel Corporation, Santa Clara, CA (US)

(72) Inventors: Rajiv Kumar, Pulau Penang (MY); Kuan Cheng Tang, Pulau Pinang (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/719,626

(22) Filed: Sep. 29, 2017

(65) Prior Publication Data

US 2019/0103140 A1    Apr. 4, 2019

(51) Int. Cl.
| | |
|---|---|
| *G11C 17/12* | (2006.01) |
| *G11C 5/14* | (2006.01) |
| *G11C 11/417* | (2006.01) |
| *G11C 7/12* | (2006.01) |
| *G11C 8/16* | (2006.01) |
| *G11C 11/419* | (2006.01) |

(52) U.S. Cl.
CPC ............... *G11C 5/148* (2013.01); *G11C 7/12* (2013.01); *G11C 8/16* (2013.01); *G11C 11/417* (2013.01); *G11C 11/419* (2013.01); *G11C 2207/2281* (2013.01)

(58) Field of Classification Search
CPC ........................................................ G11C 7/12
USPC ........................................................ 365/191
See application file for complete search history.

(56) References Cited

U.S. PATENT DOCUMENTS

2011/0273945 A1* 11/2011 Donkoh .................... G11C 7/12
                                                                365/191

* cited by examiner

*Primary Examiner* — Jason Lappas
(74) *Attorney, Agent, or Firm* — Compass IP Law PC

(57) ABSTRACT

A memory is described. The memory includes a storage cell. The memory also includes a read bit line coupled to the storage cell. The memory also includes at least one N type pre charge transistor coupled between the read bit line and a power supply node. The at least one N type pre-charge transistor is to pre-charge the read bit line. The memory also includes at least one P type pre charge transistor that is also coupled between the read bit line and the power supply node. The at least one P type pre-charge transistor is to pre-charge the read bit line with the at least one N type transistor.

20 Claims, 9 Drawing Sheets

MEMORY READ CIRCUIT WITH N TYPE AND P TYPE PRE-CHARGE

FIELD OF INVENTION

The field of invention pertains to the electronic arts generally, and, more specifically, to a memory read circuit with N type and P type pre-charge.

BACKGROUND

Memory circuits are a fundamental component of many different kinds of electronic devices. Generally, as the performance of a memory increases, the memory of the system it is embedded within also increases. Thus, memory designers are constantly seeking ways to improve the performance of the memory circuits they design.

FIGURES

A better understanding of the present invention can be obtained from the following detailed description in conjunction with the following drawings, in which.

DETAILED DESCRIPTION

Figure 1:
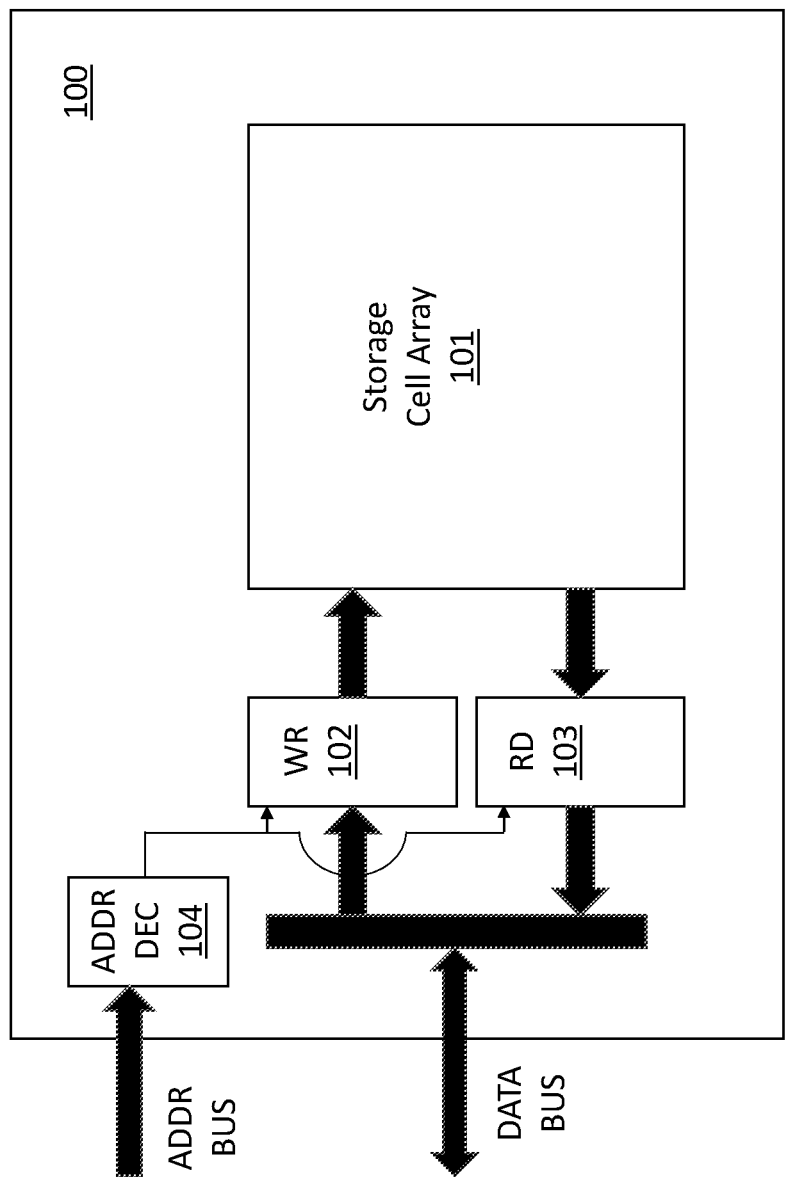
FIG. 1 shows a memory (prior art)

As is known in the art, referring to FIG. 1, a random access memory 100, such as a static random access memory (SRAM), is typically composed of an array of storage cells 101. The memory 100 also includes write circuitry 102 (to write data into one or more of the cells) and read circuitry 103 (to read data from one or more of the cells). During a write access or a read access an address is provided to the memory 100. Address decoding circuity 104 within the memory 100 effectively determines which cells are being targeted by activating: 1) the write circuitry 102 for those cells being targeted by a write in the case of a write operation; or, 2) the read circuitry 103 of those cells being targeted by a read in the case of a read operation.

Figure 2:
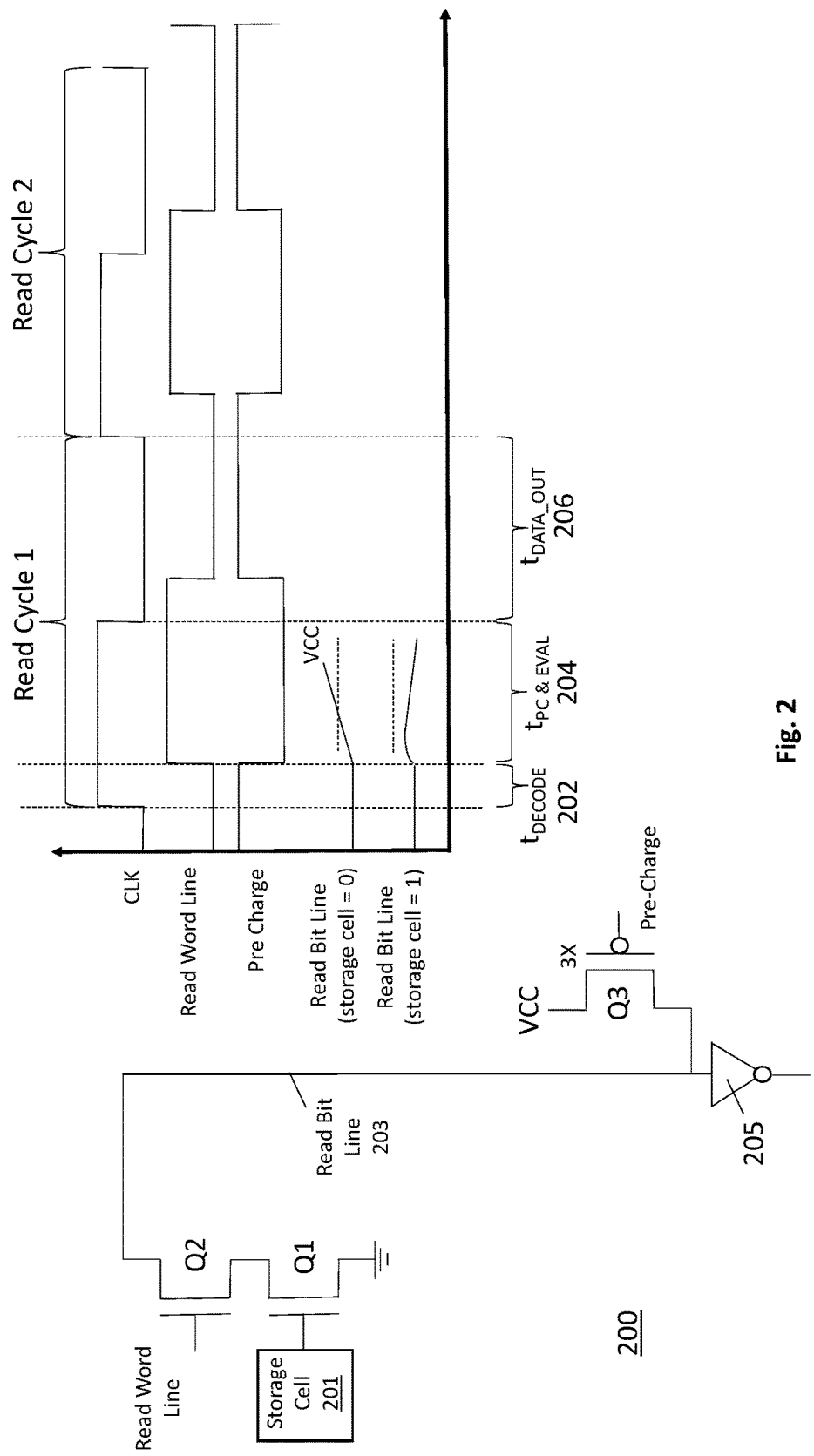
FIG. 2 shows a memory read circuit with P type pre charge (prior art)

FIG. 2 shows a prior art read circuit 200 for a static random access memory (SRAM) storage cell 201. According to the operation of the read circuit of FIG. 2, when a read address is presented to the memory, the read address is decoded by address decoding logic circuitry (not depicted in FIG. 2 for illustrative ease). The time consumed by the read address decoding process is depicted as $t_{DECODE}$ 202 in FIG. 2.

If storage cell 201 is targeted by the write operation, a logic HI is presented to transistor Q2 which turns transistor Q2 "on". A stored bit value (a logic HI or a logic LO) is presented from the storage cell 201 to the gate of transistor Q1. With transistor Q2 on, the stored value in the storage cell 201 affects the bias of transistor Q1 which, in turn, affects the voltage on the read bit line 203.

Specifically, if the storage cell 201 holds a logic HI, transistor Q1 will be on. In this case, during a pre-charge and evaluation phase 204, both transistors Q1 and Q2 will be on which will cause the read bit line 203 to be pulled to the reference potential (GND). Here, also during the pre-charge and evaluation phase 204, transistor Q3 is on which attempts to pull the voltage on the read bit line 203 up to VCC.

However, the pull down strength of transistors Q1 and Q2 is greater than the pull up strength of transistor Q3 (e.g., transistors Q1 and Q2 are much larger (have greater gain) than transistor Q3). As such, when the storage cell 201 is holding a logic HI, transistors Q1 and Q2 are able to pull the read bit line voltage 203 to GND during the pre-charge and decode phase 204 even though transistor Q3 is on and attempting to pull the read bit line voltage up to VCC.

Inverting sense amplifier 205 will interpret the voltage on the read bit line 203 as a logic LO and present a logic HI as the logic value that is read from the storage cell 201. The sensing of the read bit line 203 by the inverting sense amplifier 205 marks the end of the pre-charge and evaluation phase 204. After the inverting sense amplifier 205 has formally sensed the voltage on the read bit line 203, a logic HI is presented as the storage cell's formal read value from the memory chip during a read data out phase 206. A read (or write) operation may then immediately follow.

By contrast, if the storage cell 201 holds a logic LO, transistor Q1 will be off and transistors Q1 and Q2 have no influence on the voltage level of the read bit line 203. Notably, transistor Q3 is turned on during the pre-charge and evaluation phase 204 irrespective of the value stored in the storage cell 201. With transistors Q1 and Q2 being off in the case where the storage cell 201 holds a logic LO, transistor Q3 is able to pull the voltage of the read bit line 203 up to VCC (being off, transistors Q1 and Q2 do not over power transistor Q3).

As such, inverting sense amplifier 205 will intepret the voltage on the read bit line 203 as a logic HI and present at its output a logic LO as the read value. The sensing of the read bit line 203 by the inverting sense amplifier 205 marks the end of the pre-charge and evaluation phase 204. After the inverting sense amplifier 205 has formally sensed the value on the read bit line 203, a logic LO is presented as the storage cell's formal read value from the memory chip during a read data out phase 206. A read (or write) operation may then immediately follow.

With the prior art approach of FIG. 2, some inefficiency exists in both read cases. That is, some inefficiency exists in the process of reading the storage cell 201 when the storage cell 201 holds a logic HI, and, some inefficiency exists in the process of reading the storage cell 201 when the storage cell holds a logic LO.

Figure 3:
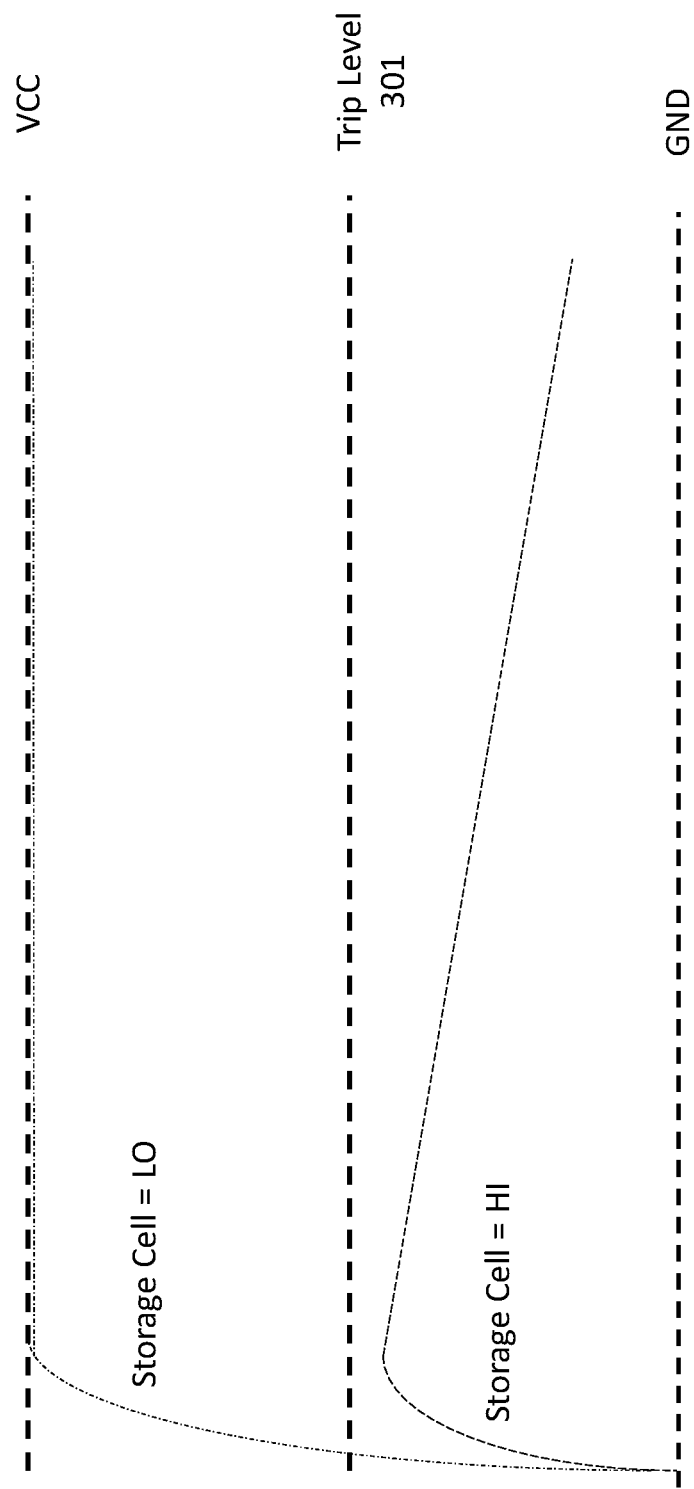
FIG. 3 shows read bit line voltages for the circuit of FIG. 2.

FIG. 3 helps to explain the inefficiency in greater detail. FIG. 3 shows the "trip level" 301 of the inverting sense amplifier 205 of FIG. 2. At the end of the pre-charge and evaluate phase 204, if the voltage on the read bit line 203 is beneath the trip level 301 (which should be the case if the storage cell is holding a logic HI), the inverting sense amplifier will interpret its input voltage as a logic LO and provide a logic HI at its output. By contrast, if at the end of the pre-charge and evaluate phase 204 the voltage on the read bit line 203 is above the trip level 301 (which should be the case if the storage cell is holding a logic HI), the inverting sense amplifier 205 will interpret its input voltage as a logic HI and generate a logic LO at its output.

In the prior art approach of FIG. 2, because pre charge transistor Q3 is a P type transistor, it attempts to pull the voltage on the read bit line 203 all the way up to VCC. As such, pre charge transistor Q3 can characterized as a fairly strong pull-up. As a consequence, as discussed above, transistors Q1 and Q2 need to be sufficiently stronger/larger than Q3 in order to sufficiently pull the voltage on the read bit line down to GND in the case where the storage cell 201 holds a logic HI. As such, there is some loss of storage cell density (the unit cell of the read circuitry becomes larger which can reduce the number of storage cells that can be integrated onto the semiconductor chip surface).

Because of this inefficiency, designers will be motivated to get away with designing transistors Q1 and Q2 to be as small as possible, yet still be just large enough to over power transistor Q3 and drive the voltage on the read bit line 203 beneath the trip level 301. A problem with this approach is a resulting tradeoff between noise margin and speed.

As transistors Q1 and Q2 become smaller, they will have more difficulty over powering transistor Q3 which translates into the voltage on the read bit line reaching a voltage level that may be "too close" to the trip level when the storage cell is storing a logic HI. FIG. 3 attempts to depict the read bit line voltage extending too close to the trip level 301 when the stored value is a logic HI.

Here, referring to the logic HI waveform of FIG. 3, rather than being clamped immediately to GND, the voltage on the read bit line 203 will hover too close to the trip level 301 absolutely or at least for too long a time period. The former corresponds to a noise margin concern (in a noisy environment the voltage level could extend above the trip level 301 which could result in an incorrect interpretation of the voltage on the read bit line 203). The later corresponds to longer access time of the memory cell (the circuitry has to wait for too long a time period before the voltage level on the read bit line 203 falls appreciably beneath the trip level 301). Thus, FIG. 3 depicts these issues by showing a stored value=HI read bit line voltage that extends too close to the trip level 301 and is pulled down too slowly.

Additionally, in the case where the storage cell 201 stores a logic HI, the opposite problem may present itself. That is, because pre charge transistor Q3 is a P type transistor and attempts to pull the read bit line voltage all the way up to VCC, in the case where the stored value is a logic LO, Q3 will successfully drive the read line bit voltage all the way to VCC which is excessive from a noise margin perspective at least. That is, puling the read bit line voltage all the way up to VCC consumes too much power as the voltage level of the read bit line 203 could have been brought sufficiently above the trip level 301 with a lower pull-up voltage (e.g., 0.75*VCC). FIG. 3 therefore also depicts this issue by showing a stored value=LO read bit line voltage that extends too far above the trip level 301.

Figure 4:
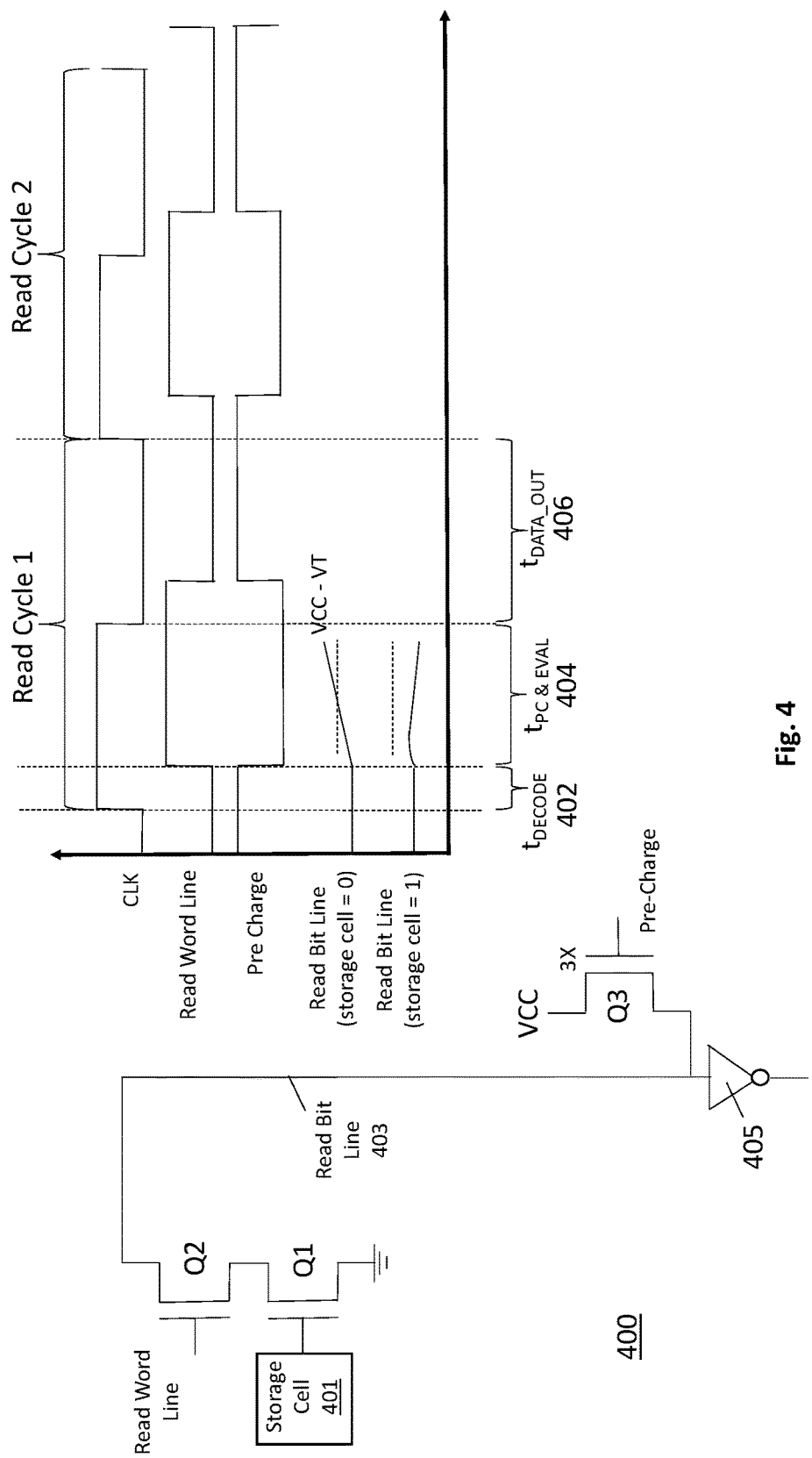
FIG. 4 shows a memory read circuit with N type pre charge (prior art)

FIG. 4 shows another approach that at least attempts to address the later problem. As observed in the circuit of FIG. 4, pre charge transistor Q3 is implemented with an N type transistor instead of a P type transistor. Because Q3 is implemented with an N type transistor, transistor Q3 of FIG. 4 can be characterized as a weaker pull-up transistor than the P type transistor of FIG. 2 because the N type Q3 transistor of FIG. 4 will only attempt to bring the read bit line voltage 403 up to a voltage of VCC-VT where VT is the threshold voltage of transistor Q3 (by contrast, recall that transistor Q3 of FIG. 2 will attempt to bring the read bit line voltage all the way up to VCC).

Thus, the circuit of FIG. 4 operates the same as the circuit of FIG. 2 described above except that the Q3 pre charge transistor of FIG. 4 only attempts to pull the voltage of the read bit line 403 to a voltage of VCC-VT (rather than VCC).

A problem with the approach of FIG. 4, however, is that VT is potentially too large a reduction from VCC resulting in noise margin concerns when the stored value is a logic LO and the voltage of the read bit line 403 is supposed to be pulled above the trip level. For example, consider an underlying technology in which VCC=0.8 V and VT=0.25V. In this case, the trip level of the inverting sense amplifier 405 will be approximately 0.4 V and the N type Q3 transistor will nominally only pull the read bit line voltage up to a voltage of 0.5V (0.8V−0.25V=0.55V). Thus, in this example, the N type pre charge transistor Q3 only brings the read bit line voltage .05V above the trip level which may not be high enough at least in noisy environments.

Figure 5:
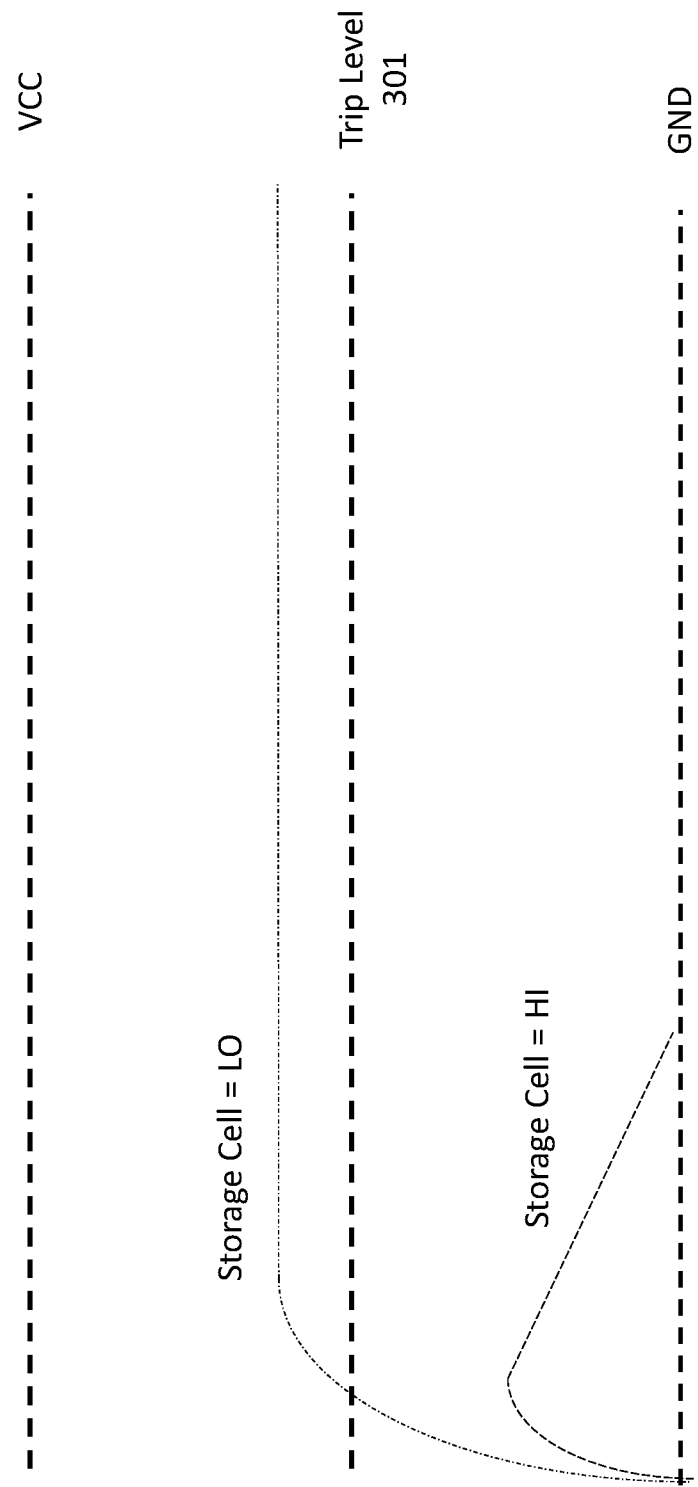
FIG. 5 shows read bit line voltages for the circuit of FIG. 4.

FIG. 5 shows the read bit line voltage waveforms for both the storage cell value=HI and LO cases. As can be seen in FIG. 5, with the weaker N type pre charge transistor, the waveform does not reach the trip level 301 nor decays too slowly in the case when the storage cell is holding a HI logic value. However, unfortunately, in the case where the storage cell is holding a logic LO, the weaker N type pre charge does not bring the read bit line voltage sufficiently above the trip level 301 which potentially translates into noise margin concerns/issues.

Referring to FIGS. 2 and 4, note that the pre-charge Q3 transistor has a "3×" characterization which means that the Q3 pre-charge transistor is actually implemented as three separate transistors arranged in a parallel arrangement. That is, in actuality, the Q3 pre-charge transistors of FIGS. 2 and 4 are each implemented as three transistors each of whose conductive channel is located between VCC and the read bit line 203, 403.

Figure 6:
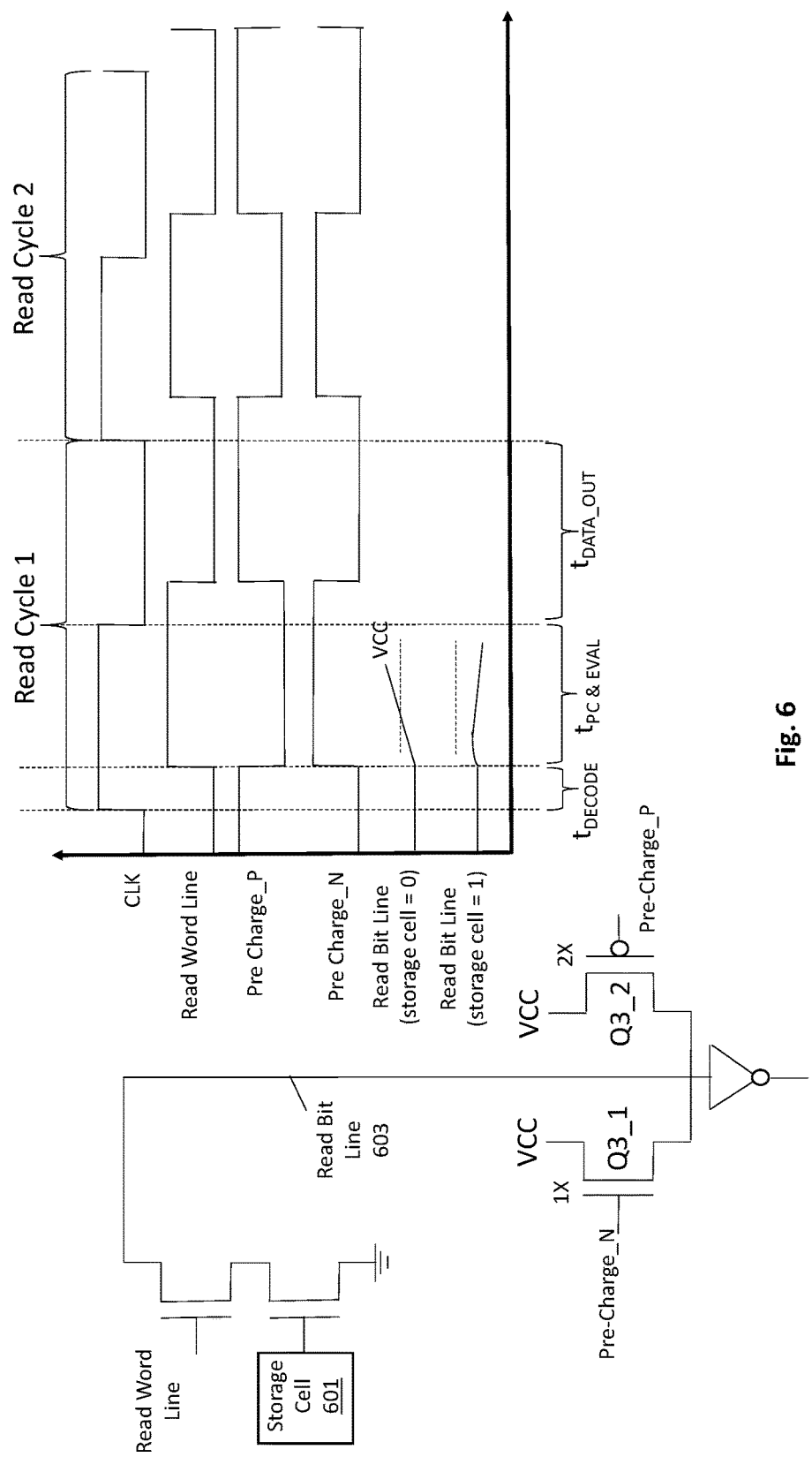
FIG. 6 shows an improved memory read circuit with P and N type pre charge.

FIG. 6 shows an improved read circuit that does not suffer the drawbacks discussed above with respect to the P type pre-charge transistor approach of FIG. 2 or the N type pre-charge transistor approach of FIG. 4. The improved approach of FIG. 6 uses a combination of P type and N type pre-charge transistors. Specifically, whereas the three Q3 pre-charge transistors of FIG. 2 were all P type transistors and the three Q3 pre-charge transistors of FIG. 4 were all N type transistors, by contrast, the three Q3 pre-charge transistors of FIG. 6 include one N type transistor Q3_1 and two P type transistors Q3_2. As described immediately below, including a combination of P and N type transistor technology for the overall pre-charge Q3 transistor function alleviates each of the concerns raised above with respect to the prior art approaches of FIGS. 2 and 4.

Figure 7:
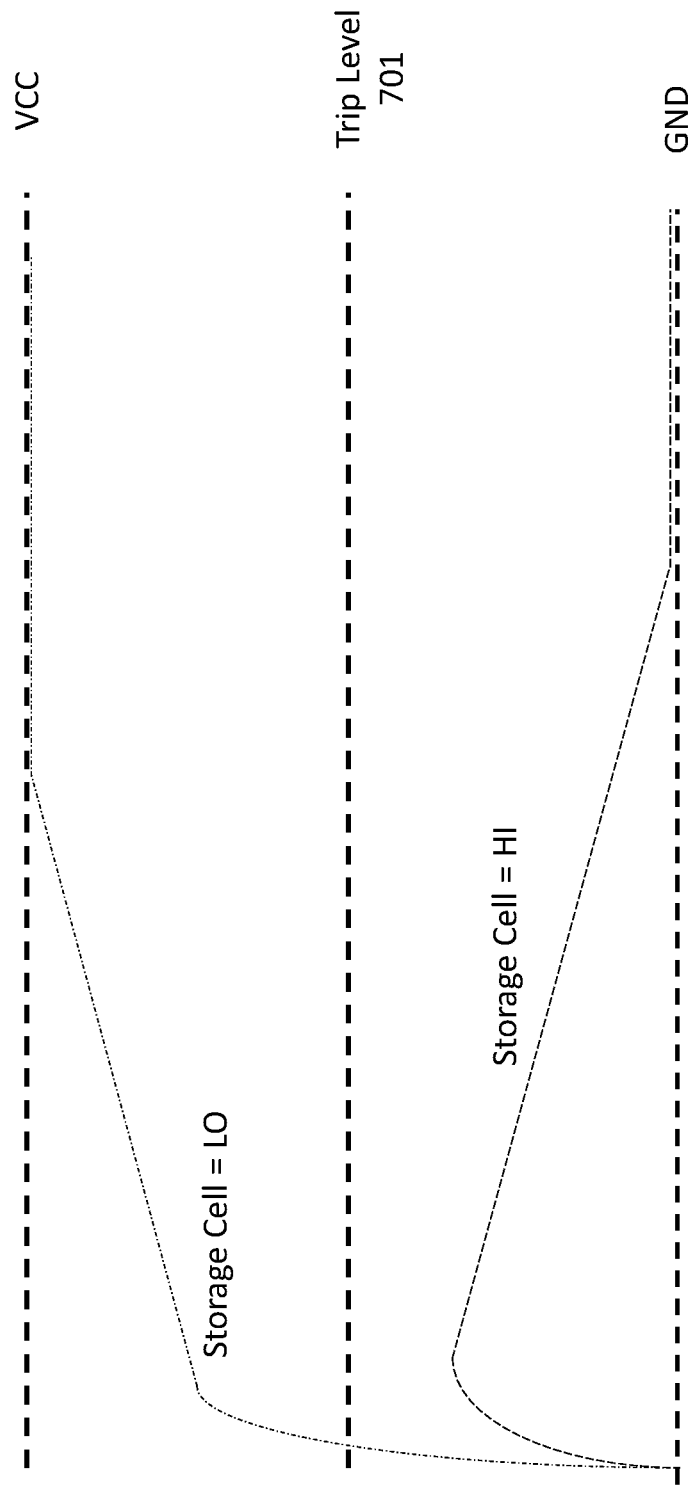
FIG. 7 shows read bit line voltages for the circuit of FIG. 6.

FIG. 7 shows comparative read bit line voltage waveforms for when the value stored by the storage cell is a logic HI and when the value stored by the storage cell is a logic LO. Qualitatively, the combined P and N pre-charge Q3 transistor approach of FIG. 6 results in a Q3 pre-charge transistor function that does not pull-up as strong as the all P type approach of FIG. 2 but that is also not as weak as the all N type approach of FIG. 4. Because the pull up is not as strong as the all P type approach of FIG. 2, the read bit line voltage in the case where the stored value is a logic HI does not approach near enough to the trip level 701 to raise noise margin concerns.

When the stored value is a logic HI, initially, the N type pre-charge transistor and both P transistors pull up the read bit line voltage. However, whereas the two P type pre-charge transistors are trying to pull the read bit line voltage up to VCC, the N type pre-charge transistor is only trying to pull the read bit line voltage up to VCC-VT. As such, the resulting waveform can be viewed as a combination of the stored value=HI waveforms of FIGS. 3 and 5. Here, the weaker pull up from the N type transistor diminishes the overall pull up activity as compared to the approach of FIG. 3 (where all three pre charge transistors are P type) so that the waveform remains sufficiently beneath the trip level (noise margin concerns are reduced as compared to the stored value=HI waveform of FIG. 3).

Moreover, in the case where the value stored by the storage cell is a logic LO, all three transistors initially act to quickly bring the read bit line voltage above the trip level. However, as the voltage on the read bit line voltage approaches VCC-VT, the N type transistor will begin to turn off. The P type pre charge transistors will continue to drive the read bit line voltage upward toward VCC. However, as the N type transistor begins to turn off and then completely turns off when the read bit line voltage reaches VCC-VT, the read bit line voltage will more slowly ramp up to VCC. Thus, firstly, the read bit line voltage quickly rises above the trip level (because all three transistors are on and contribute to the pull up f the bit line voltage). As such, there is reduced concern regarding speed of operation of the memory device. Secondly, once the read bit line voltage reaches VCC-VT, it more slowly rises to VCC. As such there is no noise margin concern or high power consumption concern.

As such, the combined P and N type pre-charge transistor approach of FIG. 6 alleviates concerns associated with either/both of the prior art approaches of FIGS. 2 and 4. It is pertinent to point that three transistors per pre-charge transistor function and an N/P combination mixture of 1/3 N type and 2/3 P type are only exemplary. Other embodiments may exist where the number of actual pre charge transistors is different and/or the percentage mixture of N type vs. P type is different. Those of ordinary skill will be able to determine these specifics in view of their particular application.

Various embodiments may employ the improved read circuitry in an SRAM memory including, as just one example, an SRAM memory that is embedded in a field programmable gate array (FPGA). As is known in the art, an FPGA is a semiconductor chip that relies upon a memory circuit, such as an SRAM, to implement one or more Boolean logic functions. Here, the logical input to the logic function is handled as an address that is presented to the memory device. The memory device is loaded with the appropriate output logical values of the logic function(s) for each logical input/address. As such, the memory device behaves much like a look-up table.

In yet other embodiments the SRAM memory may be embedded in a processor chip as a local cache for one or more (e.g., general purpose) processing cores.

In still yet other embodiments the combined P type and N type pull-up approach described above is implemented in other types of memory circuits than an SRAM circuit. For example, various types of read only memory (ROM) circuits are believed to be able to incorporate a combined N type and P type pull-up approach.

Figure 8:
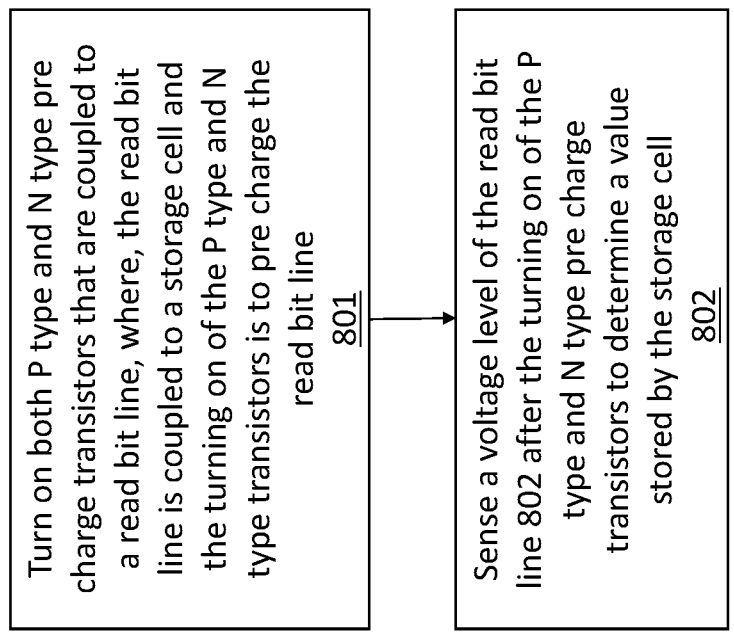
FIG. 8 shows a method performed by the memory read circuit of FIG. 6.

FIG. 8 shows a method for reading a storage cell as described above. The method includes turning on both P type and N type pre charge transistors 801 that are coupled to a read bit line, where, the read bit line is coupled to the storage cell and the turning on of the P type and N type transistors is to pre charge the read bit line. The method also includes sensing a voltage level of the read bit line 802 after the turning on of the P type and N type pre charge transistors to determine a value stored by the storage cell.

Figure 9:
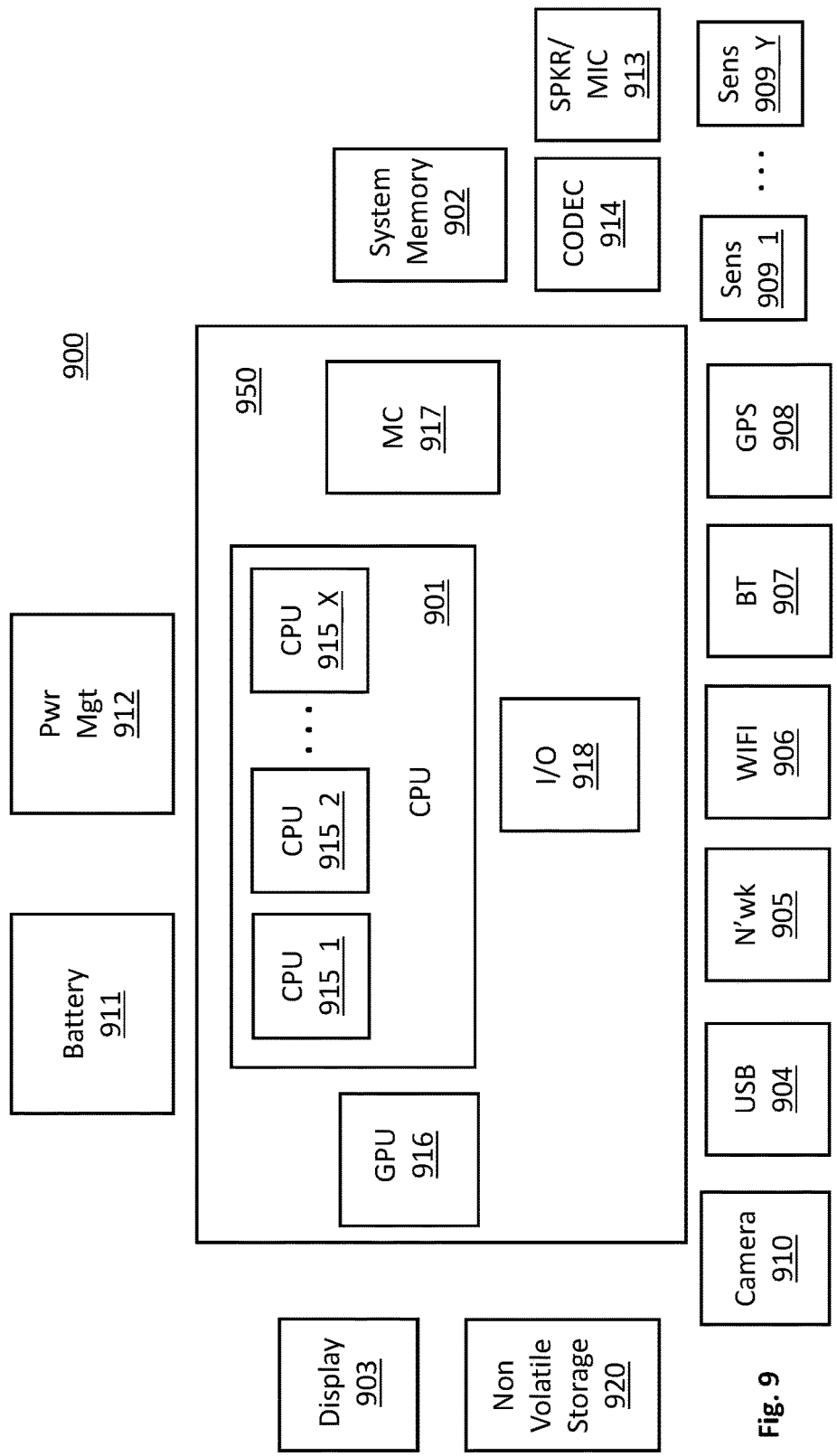
FIG. 9 shows a computing system.

FIG. 9 provides an exemplary depiction of a computing system 900 (e.g., a smartphone, a tablet computer, a laptop computer, a desktop computer, a server computer, etc.). As observed in FIG. 9, the basic computing system 900 may include a central processing unit 901 (which may include, e.g., a plurality of general purpose processing cores 915_1 through 915_X) and a main memory controller 917 disposed on a multi-core processor or applications processor, system memory 902, a display 903 (e.g., touchscreen, flat-panel), a local wired point-to-point link (e.g., USB) interface 904, various network I/O functions 905 (such as an Ethernet interface and/or cellular modem subsystem), a wireless local area network (e.g., WiFi) interface 906, a wireless point-to-point link (e.g., Bluetooth) interface 907 and a Global Positioning System interface 908, various sensors 909_1 through 909_Y, one or more cameras 910, a battery 911, a power management control unit 912, a speaker and microphone 913 and an audio coder/decoder 914.

An applications processor or multi-core processor 950 may include one or more general purpose processing cores 915 within its CPU 901, one or more graphical processing units 916, a memory management function 917 (e.g., a memory controller) and an I/O control function 918. The general purpose processing cores 915 typically execute the operating system and application software of the computing system. The graphics processing unit 916 typically executes graphics intensive functions to, e.g., generate graphics information that is presented on the display 903. The memory control function 917 interfaces with the system memory 902 to write/read data to/from system memory 902. The power management control unit 912 generally controls the power consumption of the system 900.

Each of the touchscreen display 903, the communication interfaces 904-707, the GPS interface 908, the sensors 909, the camera(s) 910, and the speaker/microphone codec 913, 914 all can be viewed as various forms of I/O (input and/or output) relative to the overall computing system including, where appropriate, an integrated peripheral device as well (e.g., the one or more cameras 910). Depending on implementation, various ones of these I/O components may be integrated on the applications processor/multi-core processor 950 or may be located off the die or outside the package of the applications processor/multi-core processor 950.

The computing system may also include field programmable gate array circuitry to perform any of a wide range of logical functions. The computing system may also include one or more caches that are local to the general purpose processing cores 915. In various embodiments, the field programmable gate array and/or the local caches are implemented with a memory, such as an SRAM, having P type and N type pre charge of its read bit lines as discussed at length above. Alternatively or in combination the computing system may include another type of memory, such as a read only memory (ROM) having P type and N type pre charge of its read bit lines as discussed at length above.

Application software, operating system software, device driver software and/or firmware executing on a general purpose CPU core (or other functional block having an instruction execution pipeline to execute program code) of an applications processor or other processor may perform any of the functions described above.

Embodiments of the invention may include various processes as set forth above. The processes may be embodied in machine-executable instructions. The instructions can be used to cause a general-purpose or special-purpose processor to perform certain processes. Alternatively, these processes may be performed by specific hardware components that contain hardwired logic for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A memory, comprising:
   a storage cell;
   a read bit line coupled to the storage cell;
   at least one N type pre charge transistor coupled between the read bit line and a power supply node, the at least one N type pre-charge transistor to pre-charge the read bit line;
   at least one P type pre charge transistor also coupled between the read bit line and the power supply node, the at least one P type pre-charge transistor to pre-charge the read bit line with the at least one N type transistor;
   wherein, the read bit line is coupled between the at least one N type pre charge transistor and the at least one P type pre charge transistor, and wherein, the N type pre charge transistor and the P type pre charge transistor have respective ends of their channels coupled to each other at the read bit line without any active elements between the respective ends of their channels.

2. The memory of claim 1 wherein the at least one P type pre charge transistor is to attempt to pre charge the read bit line to the power supply node's voltage level.

3. The memory of claim 2 wherein the at least one N type pre charge transistor is to attempt to pre charge the read bit line to the power supply node's voltage level less a threshold voltage of the at least one N type pre charge transistor.

4. The memory of claim 3 wherein the at least one N type pre charge transistor is to turn off when pull activity of the pre-charge transistors causes the read bit line voltage to reach the power supply node's voltage level less the threshold voltage of the at least one N type pre charge transistor.

5. The memory of claim 4 wherein the at least one P type pre charge transistor is to continue to drive the read bit line voltage to the power supply node voltage after the turn off of the at least one N type pre charge transistor.

6. The memory of claim 1 wherein the number of P type pre charge transistors is greater than the number of N type transistors.

7. The memory of claim 1 wherein the memory is an SRAM memory.

8. The memory of claim 7 wherein the SRAM memory is embedded within an field programmable gate array.

9. The memory of claim 7 wherein the SRAM memory is a cache for at least one general purpose processing core.

10. A computing system, comprising:
    a plurality of processing cores;
    a system memory controller;
    a system memory;
    an SRAM memory, the SRAM memory comprising:
      a storage cell;
      a read bit line coupled to the storage cell;
      at least one N type pre charge transistor coupled between the read bit line and a power supply node, the at least one N type pre-charge transistor to pre-charge the read bit line;
      at least one P type pre charge transistor also coupled between the read bit line and the power supply node, the at least one P type pre-charge transistor to pre-charge the read bit line with the at least one N type transistor;
      wherein, the read bit line is coupled between the at least one N type pre charge transistor and the at least one P type pre charge transistor, and wherein, the N type pre charge transistor and the P type pre charge transistor have respective ends of their channels coupled to each other at the read bit line without any active elements between the respective ends of their channels.

11. The computing system of claim 10 wherein the at least one P type pre charge transistor is to attempt to pre charge the read bit line to the power supply node's voltage level.

12. The computing system of claim 11 wherein the at least one N type pre charge transistor attempt to pre charge the read bit line to the power supply node's voltage level less a threshold voltage of the at least one N type pre charge transistor.

13. The computing system of claim 12 wherein the at least one N type pre charge transistor is to turn off when pull activity of the pre-charge transistors causes the read bit line voltage to reach the power supply node's voltage level less the threshold voltage of the at least one N type pre charge transistor.

14. The computing system of claim 13 wherein the at least one P type pre charge transistor is to continue to drive the read bit line voltage to the power supply node voltage after the turn off of the at least one N type pre charge transistor.

15. The computing system of claim 10 wherein the number of P type pre charge transistors is greater than the number of N type transistors.

16. The computing system of claim 7 wherein the SRAM memory is embedded within a field programmable gate array.

17. The computing system of claim 7 wherein the SRAM memory is a cache for at least one general purpose processing core.

18. A method of reading a memory storage cell, comprising:
    turning on both P type and N type pre charge transistors that are coupled to a read bit line, the read bit line coupled to the storage cell and coupled between the P type and N type pre charge transistors, the turning on of the P type and N type transistors to pre charge the read bit line, the N type pre charge transistor and the P type pre charge transistor having respective ends of their channels coupled to each other at the read bit line without any active elements between the respective ends of their channels such that the turning on of the P type and N type transistors causes both the P type and N type transistors to observe a same pre-charging voltage;

sensing a voltage level of the read bit line after the turning on of the P type and N type pre charge transistors to determine a value stored by the storage cell.

19. The method of claim 18 further comprising the N type pre charge transistor turning off when the read bit line voltage reaches a supply voltage less a threshold voltage of the N type pre charge transistor.

20. The method of claim 19 further comprising the P type transistor remaining on after the N type transistor has turned off to drive the read bit line voltage to the supply voltage.

\* \* \* \* \*